United States Patent
Yamada et al.

(10) Patent No.: US 9,926,624 B2
(45) Date of Patent: Mar. 27, 2018

(54) FILM FORMING METHOD AND FILM FORMING APPARATUS

(71) Applicant: TOKYO ELECTRON LIMITED, Tokyo (JP)

(72) Inventors: Kazuki Yamada, Nirasaki (JP); Masato Morishima, Nirasaki (JP); Kenji Ouchi, Nirasaki (JP); Taiki Katou, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 14/747,001

(22) Filed: Jun. 23, 2015

(65) Prior Publication Data

US 2015/0368802 A1    Dec. 24, 2015

(30) Foreign Application Priority Data

Jun. 24, 2014  (JP) ................................. 2014-129522
May 11, 2015  (JP) ................................. 2015-096738

(51) Int. Cl.

| | | |
|---|---|---|
| *C23C 16/34* | (2006.01) | |
| *H01J 37/32* | (2006.01) | |
| *C23C 16/36* | (2006.01) | |
| *C23C 16/507* | (2006.01) | |
| *H01L 51/52* | (2006.01) | |

(52) U.S. Cl.
CPC ............ *C23C 16/345* (2013.01); *C23C 16/36* (2013.01); *C23C 16/507* (2013.01); *H01J 37/3211* (2013.01); *H01J 37/3244* (2013.01); *H01J 37/32174* (2013.01); *H01L 51/5256* (2013.01)

(58) Field of Classification Search
CPC ..... C23C 16/345; C23C 16/507; C23C 16/36; H01J 37/3211; H01J 37/32174; H01J 37/3244; H01L 51/5253; H01L 51/5256; H01L 51/5012; H01L 2251/5338
See application file for complete search history.

(56) References Cited

U.S. PATENT DOCUMENTS

| | | | | |
|---|---|---|---|---|
| 2009/0102027 A1* | 4/2009 | Toriumi | ................ | C23C 16/308 257/649 |
| 2012/0171391 A1* | 7/2012 | Won | ...................... | C23C 16/345 427/575 |
| 2016/0312363 A1* | 10/2016 | Yamashita | ............ | C23C 16/507 |

FOREIGN PATENT DOCUMENTS

JP   2005-166265 A   6/2005

OTHER PUBLICATIONS

Gautam R. Desiraju, "Hydrogen Bridges in Crystal Engineering: Interactions without Borders", Acc. Chem. Res. 2002, 35, 565-573.

* cited by examiner

*Primary Examiner* — Dah-Wei D. Yuan
*Assistant Examiner* — Jose Hernandez-Diaz
(74) *Attorney, Agent, or Firm* — Nath, Goldberg & Meyer; Jerald L. Meyer

(57) ABSTRACT

There is provided a method of forming a sealing film to seal a device formed on a substrate, including: supplying a mixture gas including a silicon-containing gas and a halogen element-containing gas or a mixture gas including a silicon-containing gas and a gas containing a functional group having an electronegative property stronger than that of nitrogen, as a first mixture gas, into a processing container; generating plasma of the first mixture gas within the processing container; and forming a first sealing film to cover the device using the first mixture gas activated by the plasma.

7 Claims, 13 Drawing Sheets

FILM FORMING METHOD AND FILM FORMING APPARATUS

CROSS-REFERENCE TO RELATED APPLICATIONS

This application claims the benefit of Japanese Patent Applications Nos. 2014-129522 and 2015-096738, filed on Jun. 24, 2014 and May 11, 2015, respectively, in the Japan Patent Office, the disclosures of which are incorporated herein in their entirety by reference.

TECHNICAL FIELD

Various aspects and embodiments of the present disclosure relate to a film forming method and a film forming apparatus.

BACKGROUND

An organic electroluminescence (EL) device that emits light using an organic compound generally includes a structure in which an organic layer formed on a glass substrate is sandwiched between a positive electrode layer (anode) and a negative electrode layer (cathode). The organic layer is vulnerable to moisture. As such, when the moisture is mixed into the organic layer, characteristics of the organic layer are changed to cause a non-emitting point (dark spot). This shortens a lifespan of the organic EL device. Thus, it is very important to increase a sealing property of a film such that ambient moisture or oxygen does not penetrate through the organic EL device.

As a method of protecting the organic layer from ambient moisture or the like, for example, there is a method in which a sealing can is formed of aluminum or the like. According to this method, the sealing can is attached to the organic EL device with a sealant. In addition, a drying agent is applied to the interior of the sealing can. By doing this, the organic EL device is sealed and dried. This prevents moisture from being mixed into the organic EL device.

In such a method, however, the organic EL device needs to have a certain degree of thickness as a whole to ensure high resistance against moisture. This fails to obtain the original advantages of the organic EL device, such as thin, light, and bendable characteristics.

SUMMARY

Some embodiments of the present disclosure provide a film forming method and a film forming apparatus, which are capable of providing a sealing film to seal a device such as an organic EL device, the sealing film having a high moisture-proof property and a thin thickness.

According to one embodiment of the present disclosure, there is provided a method of forming a sealing film to seal a device formed on a substrate, including: supplying a mixture gas including a silicon-containing gas and a halogen element-containing gas or a mixture gas including a silicon-containing gas and a gas containing a functional group having an electronegative property stronger than that of nitrogen, as a first mixture gas, into a processing container; generating plasma of the first mixture gas within the processing container; and forming a first sealing film to cover the device using the first mixture gas activated by the plasma.

According to another embodiment of the present disclosure, there is provided a film forming apparatus, including: a processing container; a gas supply unit configured to supply a first mixture gas into the processing container; a plasma generating unit configured to generate plasma of the first mixture gas within the processing container; and a controller configured to execute the aforementioned film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
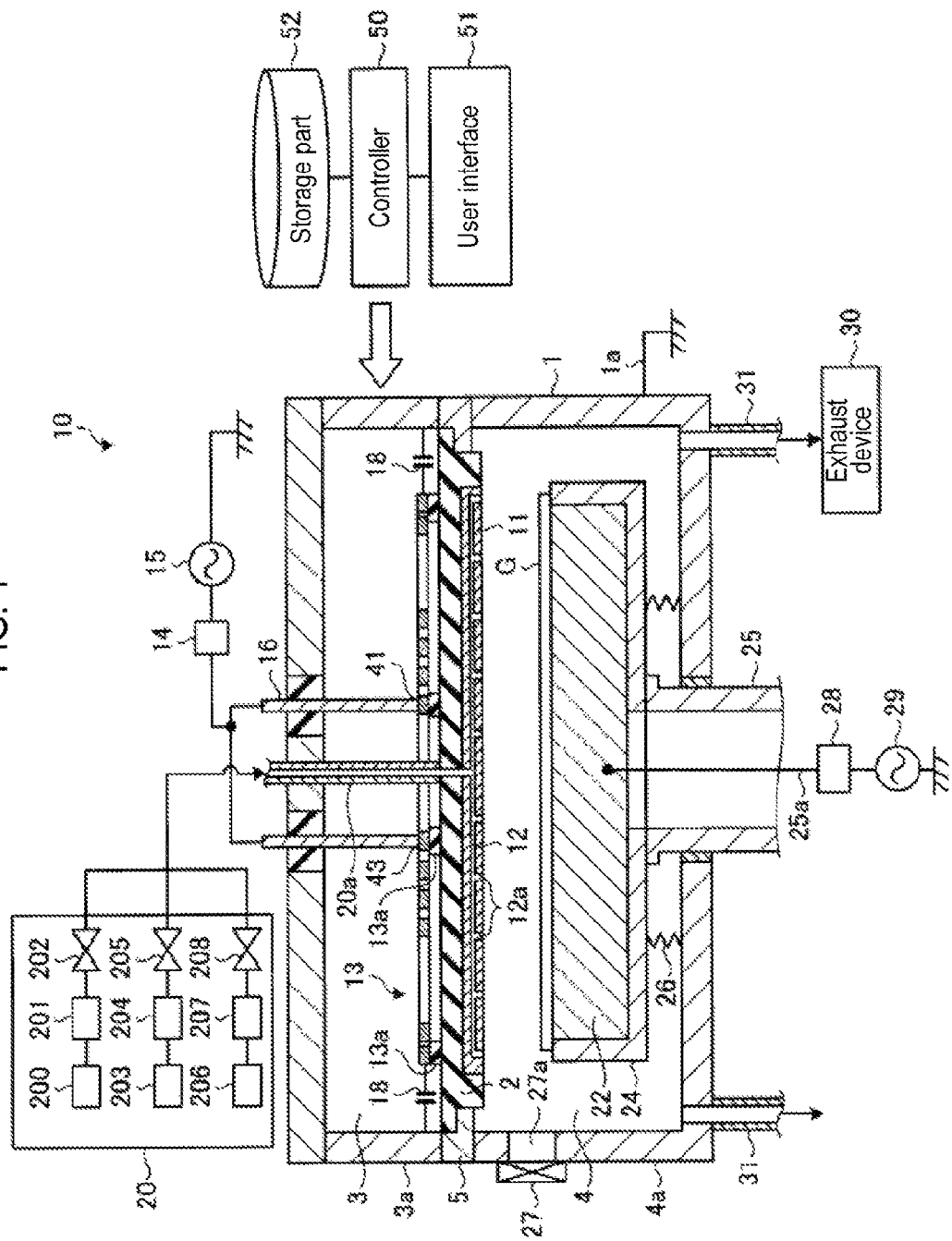
FIG. 1 is a longitudinal cross-sectional view showing an example of a film forming apparatus.

Reference will now be made in detail to various embodiments, examples of which are shown in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming method according to one embodiment is a method of forming a sealing film to seal a device formed on a substrate. The film forming method includes: a first supply step of supplying a mixture gas including a silicon-containing gas and a halogen element-containing gas or a mixture gas including a silicon-containing gas and a gas containing a functional group having an electronegative property stronger than that of nitrogen, as a first mixture gas, into a processing container; a first generation step of generating plasma of the first mixture gas within the processing container; and a first film-forming step of forming a first sealing film to cover the device using the first mixture gas activated by the plasma.

An example of the silicon-containing gas may include a silane-based gas. The silane-based gas refers to a gas represented by $Si_nH_{2n+1}$ (where n is a natural number) such as monosilane (in step $SiH_4$), disilane (in step $Si_2H_6$), or trisilane (in step $Si_3H_8$).

Further, in the film forming method according to one embodiment, the first mixture gas may include a nitrogen-containing gas, a silicon-containing gas, and a fluorine-containing gas.

Further, in the film forming method according to one embodiment, in the first mixture gas, a ratio of a flow rate of the nitrogen-containing gas to the silicon-containing gas may fall within a range from 0.8 to 1.1, and a ratio of a flow rate of the fluorine-containing gas to the silicon-containing gas may fall within a range from 0.1 to 0.4.

Further, in the film forming method according to one embodiment, the nitrogen-containing gas may be an $N_2$ gas or an $NH_3$ gas, the silicon-containing gas may be an $SiH_4$ gas, and the fluorine-containing gas may be a fluorine-containing silicon compound, for example, any one of an $SiF_4$ gas, an $SiH_3F$ gas, an $SiH_2F_2$ gas, and an $SiH_xF_{4-x}$ gas.

Further, in the film forming method according to one embodiment, the halogen element-containing gas may be any one of an $SiCl_4$ gas, an $SiH_xCl_{4-x}$ gas, an $SiH_3F$ gas, and an $SiH_xF_yCl_z$ gas.

Further, in the film forming method according to one embodiment, when the fluorine-containing gas is included as the halogen element-containing gas in the first mixture gas, a concentration of fluorine in the first sealing film may be 10 atom % or less.

Further, in the film forming method according to one embodiment, when the chlorine-containing gas is included as the halogen element-containing gas in the first mixture gas, a concentration of chlorine in the first sealing film may be 10 atom % or less.

Furthermore, the film forming method according to one embodiment may further include: a second supply step of supplying a second mixture gas including the silicon-containing gas, which does not include both the halogen element-containing gas and the gas containing a functional group having an electronegative property stronger than that of nitrogen, into the processing container; a second generation step of generating plasma of the second mixture gas within the processing container; and a second film-forming step of forming a second sealing film to cover the first sealing film formed in the first film-forming step using the second mixture gas activated by the plasma.

Further, in the film forming method according to one embodiment, a thickness of the second sealing film is 2 to 4 times as large as the first sealing film.

Further, in the film forming method according to one embodiment, the first mixture gas may include a silicon-containing gas, a halogen element-containing gas and a nitrogen-containing gas, or a silicon/halogen element-containing gas and a nitrogen-containing gas, and the second mixture gas may include a silicon-containing gas and a nitrogen-containing gas.

Further, in the film forming method according to one embodiment, the first mixture gas may include an $SiH_4$ gas, an $SiF_4$ gas and an $N_2$ gas, or an $SiH_xF_{4-x}$ gas and an $NH_3$ gas, and the second mixture gas may include an $SiH_4$ gas and an $N_2$ gas.

Furthermore, the film forming method according to one embodiment may further include: a third supply step of supplying the second mixture gas into the processing container; a third generation step of generating plasma of the second mixture gas within the processing container; and a third film-forming step of forming a third sealing film to cover the device using the second mixture gas activated by the plasma, before the first film-forming step is performed. In some embodiments, the first film-forming step may form the third sealing film to cover the third sealing film formed in the third film-forming step using the first mixture gas activated by the plasma.

Further, in the film forming method according to one embodiment, a thickness of the third sealing film may be 0.5 to 1.5 times as large as that of the first sealing film.

Further, in the film forming method according to one embodiment, assuming that a set of the first supply step, the first generation step and the first film-forming step refers to a first process, a set of the second supply step, the second generation step and the second film-forming step refers to a second process, and a set of the third supply step, the third generation step and the third film-forming step refers to a third process, the first process and the third process may be alternately repeated a plurality of times before the second process is performed.

Further, in the first supply step of the film forming method according to one embodiment, the halogen element-containing gas or the gas containing a functional group having an electronegative property stronger than that of nitrogen in the first mixture gas may be incremented from zero to a predetermined level, and subsequently, may be decremented from the predetermined level to zero.

Further, in the first supply step of the film forming method according to one embodiment, the fluorine-containing gas may be used as the halogen element-containing gas. The predetermined level may be adjusted such that a maximum concentration value of fluorine in the first sealing film falls within a range from 4 to 6 atom %.

Further, in the film forming method according to one embodiment, the functional group having an electronegative property stronger than that of nitrogen may be a carbonyl group or a carboxylate group.

Further, in the film forming method according to one embodiment, the carbonyl group may be a functional group represented by —C(=O)—; and the carboxylate group may be a functional group represented by (R)—COOH.

Further, in the film forming method according to one embodiment, a temperature of the substrate in the first film-forming step may range from 10 to 70 degrees C.

A film forming apparatus according to another embodiment includes: a processing container; a gas supply unit configured to supply a first mixture gas into the processing container; a plasma generating unit configured to generate plasma of the first mixture gas within the processing container; and a controller configured to execute the aforementioned film forming method.

Hereinafter, some embodiments of the film forming method and the film forming apparatus will be described in detail with reference to the accompanying drawings. Further, the disclosed disclosure is not limited to the embodiments. Also, the embodiments may be appropriately combined unless a conflict arises.

(First Embodiment)
[Configuration of Film Forming Apparatus 10]

FIG. 1 is a longitudinal sectional view showing an example of a film forming apparatus 10. The film forming apparatus 10 is configured as a plasma processing apparatus using an inductively-coupled plasma (ICP). The film forming apparatus 10 includes an airtight processing container 1 having a square tube shape, which is formed of, e.g., aluminum whose inner wall surface is anodized. The processing container 1 has a configuration which can be assembled and is grounded by a ground line 1a. The processing container 1 is vertically divided into an antenna chamber 3 and a processing chamber 4 by a dielectric wall 2. The dielectric wall 2 constitutes a ceiling wall of the processing chamber 4. The dielectric wall 2 is formed of a ceramic such as $Al_2O_3$, quartz, or the like.

A shower housing 11 through which a process gas is supplied is fixed into a lower portion of the dielectric wall 2. The shower housing 11 is formed in, e.g., a cross shape, and supports the dielectric wall 2 from below. Further, the shower housing 11 that supports the dielectric wall 2 is suspended from the ceiling of the processing container 1 by a plurality of suspenders (not shown).

The shower housing 11 is formed of a conductive material, in some embodiments, a metal such as aluminum whose inner surface is anodized to prevent the generation of contamination. A gas flow channel 12, which horizontally extends, is formed in the shower housing 11. A plurality of gas discharge holes 12a is formed to extend downwardly while communicating with the gas flow channel 12. Meanwhile, a gas supply pipe 20a is installed in the center of an upper surface of the dielectric wall 2 to communicate with the gas flow channel 12. The gas supply pipe 20a is installed to penetrate through the ceiling of the processing container 1 outwardly, and is coupled to a gas supply system 20.

The gas supply system 20 includes gas supply sources 200, 203 and 206, flow rate controllers 201, 204 and 207, valves 202, 205 and 208.

The gas supply source 200 which supplies a first gas containing, e.g., nitrogen or the like, is coupled to the gas supply pipe 20a through the flow rate controller 201 such as a mass flow controller, and the valve 202. The gas supply source 203 which supplies a second gas containing, e.g., silicon or the like, is coupled to the gas supply pipe 20a through the flow rate controller 204 such as a mass flow controller, and the valve 205. The gas supply source 206 which supplies a third gas containing, e.g., fluorine or the like, is coupled to the gas supply pipe 20a through the flow rate controller 207 such as a mass flow controller, and the valve 208.

A process gas supplied from the gas supply system 20 is introduced into the shower housing 11 through the gas supply pipe 20a, and subsequently, is discharged inward of the processing chamber 4 through the gas discharge holes 12a formed in the lower surface of the shower housing 11.

A support shelf 5 is installed between a sidewall 3a of the antenna chamber 3 and a sidewall 4a of the processing chamber 4 in the processing container 1 to protrude inward of the processing container 1. The dielectric wall 2 is mounted on the support shelf 5.

A radio frequency (RF) antenna 13 is disposed above the dielectric wall 2 within the antenna chamber 3 such that the RF antenna 13 faces the dielectric wall 2. The RF antenna 13 is spaced apart from the dielectric wall 2 by a predetermined distance (e.g., 50 mm or lower) with spacers 13a formed of an insulating member interposed therebetween. Four power feed members 16, which extend vertically, are installed in the vicinity of a central portion of the antenna chamber 3. The power feed members 16 are coupled to an RF power source 15 through a matcher 14. The power feed members 16 are installed around the gas supply pipe 20a.

The RF power source 15 supplies an RF power of a predetermined frequency (e.g., 13.56 MHz) to the RF antenna 13. The supply of RF power to the RF antenna 13 forms an induced electric field within the processing chamber 4. The induced electric field generates plasma of the process gas discharged from the shower housing 11. An output of the RF power source 15 is properly set to have a sufficient value to generate the plasma. A set of the RF antenna 13 and the shower housing 11 is an example of a plasma generating unit.

A susceptor 22 on which a glass substrate G is loaded, is installed in a lower portion of the processing chamber 4 such that the susceptor 22 faces the RF antenna 13 with the dielectric wall 2 interposed therebetween. The susceptor 22 is formed of a conductive material, e.g., aluminum whose surface is anodized. The glass substrate G loaded on the susceptor 22 is adsorptively held on the susceptor 22 by an electrostatic chuck (not shown).

The susceptor 22 is supported by a hollow post 25 while being received in a conductive frame 24. The post 25 penetrates through the lower portion of the processing container 1 while keeping the processing container 1 in an airtight state. Further, the post 25 is supported by a lifting mechanism (not shown) disposed outside of the processing container 1 such that the susceptor 22 is moved upward and downward by the lifting mechanism when loading or unloading the glass substrate G into or from the processing container 1.

In addition, a bellows 26 configured to air-tightly surround the prop 25 is disposed between the conductive frame 24 that receives the susceptor 22 and the lower portion of the processing container 1. This allows the susceptor 22 to be moved up and down while maintaining airtightness in the processing chamber 4. In addition, an opening 27a through which the glass substrate G is loaded and unloaded, and a gate valve 27 for opening and closing the opening 27a are installed in the sidewall 4a of the processing chamber 4.

The susceptor 22 is coupled to an RF power source 29 through a power feed bar 25a installed within the hollow post 25 and a matcher 28. The RF power source 29 applies a bias RF power of a predetermined frequency (e.g., 6 MHz) to the susceptor 22. Then, ions of plasma generated within the processing chamber 4 are effectively introduced to the glass substrate G.

Further, the susceptor 22 is provided with a temperature control mechanism (not shown) and a temperature sensor (not shown). The temperature control mechanism includes a heating unit such as a ceramic heater, a coolant flow channel or the like to control a temperature of the glass substrate G. Pipes and lines connected to components such as the temperature control mechanism and the temperature sensor are led out from the processing container 1 through the hollow post 25. The lower portion of the processing chamber 4 is coupled to an exhaust device 30 equipped with a vacuum pump or the like through an exhaust pipe 31. The exhaust device 30 exhausts gas within the processing chamber 4 such that the interior of the processing chamber 4 is maintained in a predetermined vacuum atmosphere.

The film forming apparatus 10 is connected to a controller 50 including a microprocessor (computer). Respective components, e.g., a power supply system including the RF power source 15 and the RF power source 29, a gas supply system, a driving system and the like, of the film forming apparatus 10 are controlled by the controller 50. The controller 50 is connected to a user interface 51, which includes a keyboard that enables an operator to input a command for managing the film forming apparatus 10, a display that visually displays the operating state of the film forming apparatus 10, and the like.

Further, the controller 50 is connected to a storage part 52 which stores a control program for executing various processes in the controller 50, process recipes for causing the respective components of the film forming apparatus 10 to execute processes pursuant to processing conditions. The control programs, the process recipes or the like are stored in a storage medium of the storage part 52. The storage medium may include a hard disk or a semiconductor memory, or may include a portable storage medium such as a CDROM, a DVD, or a flash memory. Also, the control programs, the process recipes or the like may be transmitted from other apparatus via a communication line, and may be properly stored in the storage part 52.

The controller 50 may read out and execute a certain control program, a process recipe or the like from the storage part 52 in response to an instruction inputted by a user through the user interface 51, thus realizing a desired process in the film forming apparatus 10.

[Configuration of RF Antenna 13]

Figure 2:
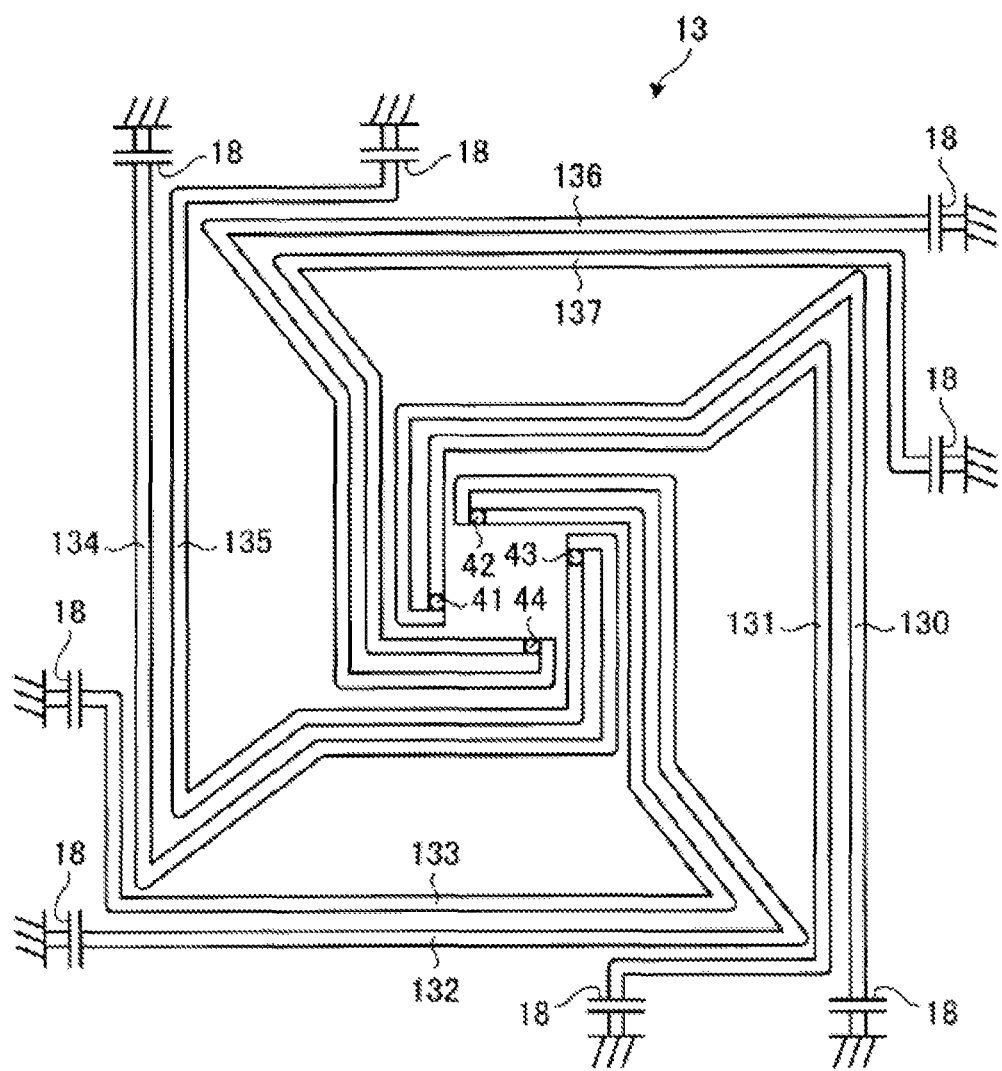
FIG. 2 is a plan view showing an example of a configuration of a radio frequency (RF) antenna.

FIG. 2 is a plan view showing an example of a configuration of the RF antenna 13. As shown in FIG. 2, the RF antenna 13 is, e.g., an octuple antenna whose outer shape is a substantially square shape. The RF antenna 13 includes eight antenna lines 130 to 137 which extend in a vortex shape swirling from the center of the RF antenna 13 to the circumference thereof. The eight antenna lines 130 to 137 are divided into four sets of paired antenna lines, each set being connected to the respective one of four power feed units 41 to 44. Each of the four power feed units 41 to 44 is connected to the respective one of the four power feed members 16.

The eight antenna lines 130 to 137 are grounded through condensers 18, respectively. The eight antenna lines 130 to 137 have the substantially same length. Capacitances of the condensers 18 connected to end portions of the antenna lines 130 to 137 are also substantially the same. Thus, currents flowing through each of the eight antenna lines 130 to 137 have the substantially same value.

Hereinafter, a schematic operation of forming a predetermined film on a substrate using the film forming apparatus 10 configured as above will be described.

First, the gaste valve 27 is opened, and then the substrate is loaded into the processing chamber 4 by a transfer mechanism (not shown) through the opening 27a and mounted on a mounting surface of the susceptor 22. The controller 50 controls the electrostatic chuck (not shown) to adsorptively hold the substrate on the susceptor 22.

Thereafter, the controller 50 controls the gas supply system 20 to supply the process gas into the processing chamber 4 through the gas discharge hole 12 of the shower housing 11. Further, the controller 50 controls the exhaust device 30 to vacuum-exhaust the interior of the processing chamber 4 through the exhaust pipe 31. By doing so, the interior of the processing chamber 4 is maintained in a predetermined pressure atmosphere.

Subsequently, the controller 50 controls the RF power source 29 to apply the RF power of, e.g., 6 MHz, to the susceptor 22. Further, the controller 50 controls the RF power source 16 to apply the RF power of, e.g., 13.56 MHz, to the RF antenna 13. Thus, a uniform induced electric field is formed within the processing chamber 4.

The induced electric field generates an inductively-coupled plasma of a high density. The generated plasma leads to the dissociation of the process gas supplied into the processing chamber 4. Also, generated film-forming species are deposited on the substrate so that a film of a predetermined material is formed on the substrate.

[Procedure of Manufacturing Light Emitting Module 100]

Figure 3:
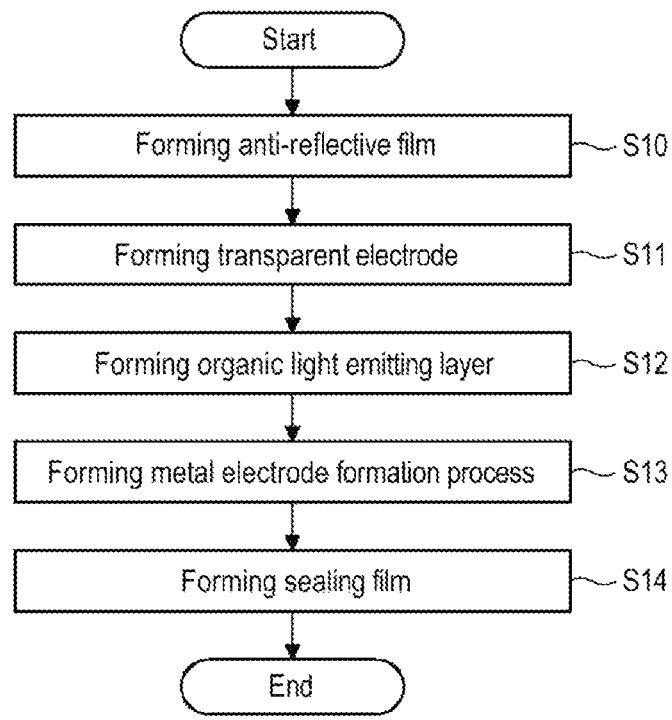
FIG. 3 is a flowchart showing an example of a procedure of manufacturing a light emitting module.
Figure 4:
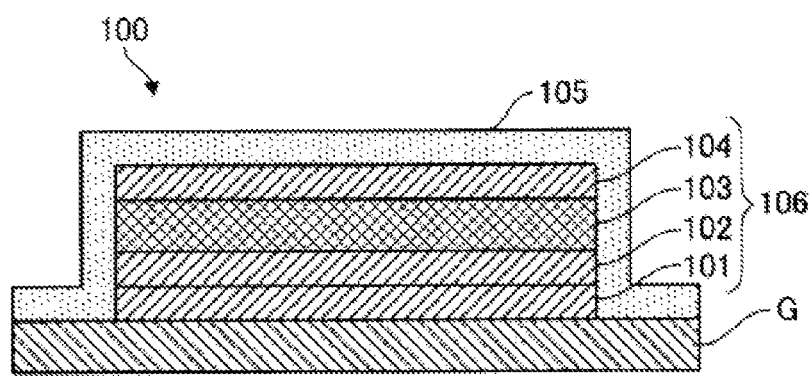
FIG. 4 is a cross-sectional view showing an example of a structure of a light emitting module according to a first embodiment.

FIG. 3 is a flowchart showing an example of a process of manufacturing a light emitting module 100 according to one embodiment. FIG. 4 is a cross-sectional view showing an example of a structure of the light emitting module 100.

First, an anti-reflective film 101 is formed on the glass substrate G using a silicon nitride (in step SiN) or the like (in step S10). Thereafter, a transparent electrode 102 is formed on the anti-reflective film 101 using an indium tin oxide (ITO), a zinc oxide (ZnO) or the like (in step S11). Subsequently, an organic light emitting layer 103 including a light emitting material such as a low molecular fluorescent pigment, a fluorescent polymer, a metal complex or the like is formed on the transparent electrode 102 (in step S12).

Subsequently, a metal electrode 104 is formed on the organic light emitting layer 103 using, e.g., aluminum (in step S13). Through a series of steps S10 to S13, an organic EL device 106 including the anti-reflective film 101, the transparent electrode 102, the organic light emitting layer 103 and the metal electrode 104 is formed on the glass substrate G. Thereafter, a sealing film 105 is formed to cover the organic EL device 106 (in step S14). In this way, for example, the light emitting module 100 having the structure as shown in FIG. 4 is obtained.

[Details of Sealing Film Forming Step]

Figure 5:
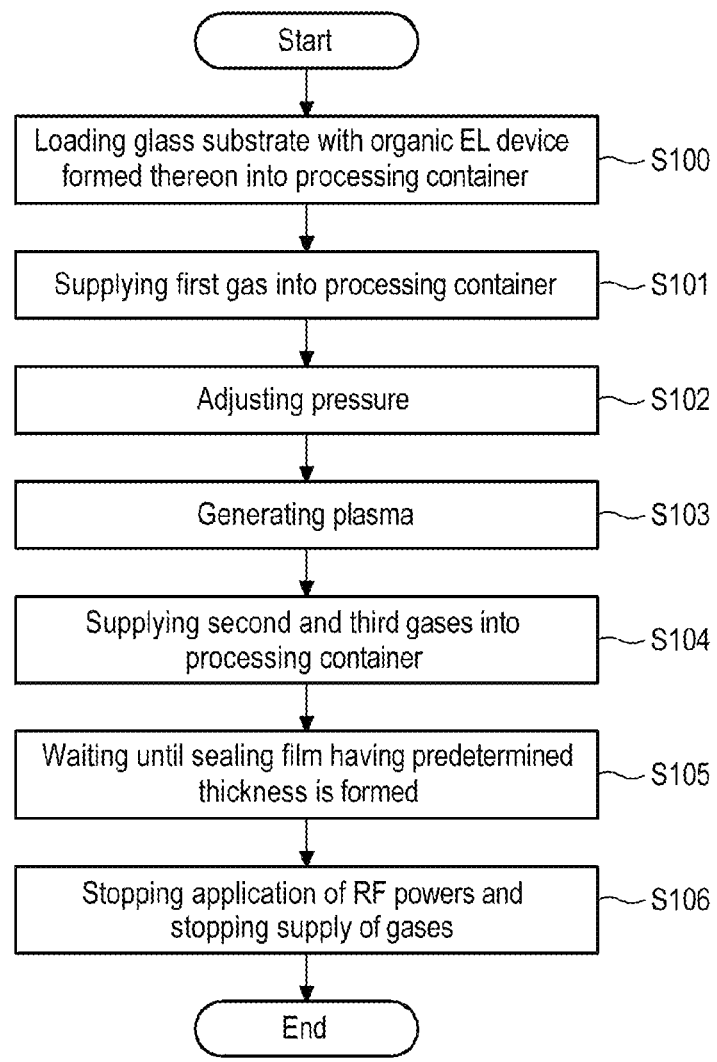
FIG. 5 is a flowchart showing an example of a sealing film forming step according to the first embodiment.

FIG. 5 is a flowchart showing an example of step of forming the sealing film 105 according to the first embodiment. This step is performed using, e.g., the film forming apparatus 10 shown in FIG. 1.

First, the gate valve 27 of the film forming apparatus 10 is opened, and the glass substrate G on which the organic EL device 106 is formed using other apparatus is loaded into the processing chamber 4 through the opening 27a (in step S100). Thereafter, the controller 50 controls the electrostatic chuck to adsorb the glass substrate G on the susceptor 22.

Subsequently, the controller 50 controls the flow rate controller 201 and the valve 202 of the gas supply system 20 to discharge the first gas into the processing chamber 4 through the gas discharge holes 12a of the shower housing 11, thus supplying the first gas into the processing chamber 4 (in step S101). In this embodiment, an example of the first gas is an $N_2$ gas. The controller 50 controls the flow rate controller 201 to adjust a flow rate of the first gas to, e.g., 27 sccm.

Subsequently, the controller 50 controls the exhaust device 30 to exhaust the gas introduced into the processing chamber 4 through the exhaust pipe 31, thus adjusting the interior of the processing chamber 4 to a predetermined pressure atmosphere (in step S102). Specifically, the controller 50 controls the exhaust device 30 to vacuum-exhaust the interior of the processing chamber 4 such that the internal pressure of the processing chamber 4 is adjusted to, e.g., 0.5 Pa.

Subsequently, the controller 50 controls the RF power source 29 to apply the RF power of, e.g., 6 MHz, to the susceptor 22. Also, the controller 50 controls the RF power source 15 to apply the RF power of, e.g., 13.56 MHz, to the RF antenna 13. This forms an induced electric field within the processing chamber 4 by the RF antenna 13. The RF power applied to the RF antenna 13 is, e.g., 2000 W. The induced electric field formed within the processing chamber 4 generates plasma of the first gas within the processing chamber 4 (in step S103).

Thereafter, the controller 50 controls each of the flow rate controller 204, the valve 205, the flow rate controller 207 and the valve 208 of the gas supply system 20 such that the second and third gases are introduced into the processing chamber 4 through the gas discharge holes 12a of the shower housing 11. Thus, the second and third gases are supplied into the processing chamber 4 (in step S104). In this embodiment, the second gas is, e.g., a $SiH_4$ gas, and the third gas is, e.g., a $SiF_4$ gas.

The controller 50 controls the flow rate controller 204 such that a ratio of a flow rate of the first gas (in this embodiment, the $N_2$ gas) to the second gas (in this embodiment, the $SiH_4$ gas) falls within, e.g., a range from 0.8 to 1.1. In this embodiment, since the flow rate of the first gas is, e.g., 27 sccm, the controller 50 controls the flow rate controller 201 and the flow rate controller 204 such that the flow rate of the second gas falls within, e.g., a range from 26 to 31 sccm.

Further, the controller 50 controls the flow rate controller 204 and the flow rate controller 207 such that a ratio of a flow rate of the second gas (in this embodiment, the $SiH_4$ gas) to the third gas (in this embodiment, the $SiF_4$ gas) falls within, e.g., a range from 0.1 to 0.4. Specifically, the controller 50 controls the flow rate controller 204 such that the flow rate of the second gas falls within, e.g., a range from 26 to 31 sccm, and controls the flow rate controller 207 such that the flow rate of the third gas falls within, e.g., a range from 5 to 10 sccm.

Thus, plasma of a mixture gas of the first gas, the second gas and the third gas is generated within the processing chamber 4. The generated plasma leads to the disassociation of the first gas, the second gas and the third gas, and film-forming species generated by the disassociation start to be deposited on the organic EL device 106 formed on the glass substrate G to cover the organic EL device 106.

Thereafter, the controller 50 waits for a predetermined period of time until the sealing film 105 has a predetermined thickness by the deposition of the film-forming species (in step S105). After the predetermined period of time elapses, the controller 50 controls the RF power source 15 and the RF power source 29 to stop the application of the RF powers, and controls the valve 202, the valve 205 and the valve 208 to block the flow of the first gas, the second gas and the third gas (in step S106). Subsequently, the controller 50 controls the exhaust device 30 to vacuum-exhaust the interior of the processing chamber 4 through the exhaust pipe 31. Thereafter, the gate valve 27 is opened and the light emitting module 100 is unloaded from the processing chamber 4 through the opening 27a.

In the sealing film forming step shown in FIG. 5, process conditions according to this embodiment are summarized as follows:

Flow rates of $N_2$, $SiH_4$ and $SiF_4$=27, 31 to 26, and 5 to 10 sccm

RF power (13.56 MHz): 2000 W (1.5 to 2 W/cm$^2$)
Internal pressure of processing chamber 4: 0.5 Pa
Gap: 150 mm
Temperature of glass substrate G: 70 degrees C.
Concentration of fluorine of sealing film 105: 10 atom % or less Wherein, Gap indicates a distance between the dielectric wall 2 and the glass substrate G. In this embodiment, the Gap is 150 mm, but may range from 80 to 200 mm. Also, in this embodiment, the internal pressure of the processing chamber 4 is 0.5 Pa, but may range from 0.5 to 2 Pa. Also, in this embodiment, the temperature of the glass substrate G is 70 degrees C., but may range from 10 to 70 degrees C.

In general, although an SiN film is amorphous, the SiN film is not completely uniform and is grown in a particle shape during a film forming process so that the SiN film has a structure in which particles are collected. The interior of the particles are very dense, but fine gaps are formed between respective particles. As such, in some cases, the gaps serve as paths along which $H_2O$ (moisture) infiltrates or penetrates. Therefore, by strengthening a connection between the SiN particles, it is possible to more strongly prevent the moisture from infiltrating into or penetrating through the gaps. Here, when the SiN film is formed using a silicon-containing material gas, hydrogen is mixed into the SiN film. This hydrogen forms a hydrogen bond between SiN particles in the SiN film. Thus, the connection of the SiN particles are strengthened, compared with an SiN film including only SiN bonds, forming an SiN film having a density higher than that of the SiN film including only SiN particles.

Further, in the SiN film, a hydrogen atom assumes a strong positive electric charge due to the hydrogen bond. A water molecule is a polar molecule, and an oxygen atom of the water molecule assumes a negative electric charge. Thus, the oxygen atom of the water molecule that enters the SiN film is attracted to the hydrogen bond within the SiN film. Accordingly, the SiN film mixed with hydrogen prevents the water molecule from passing therethrough.

Also, in the hydrogen-mixed SiN film, a hydrogen bond exists between NH . . . NH. In the sealing film forming step, a fluorine-containing $SiF_4$ gas is added so that the fluorine is mixed into the SiN film, thus generating a hydrogen bond between $NH_4^+$ . . . $F^-$ in the SiN film.

Figure 6:
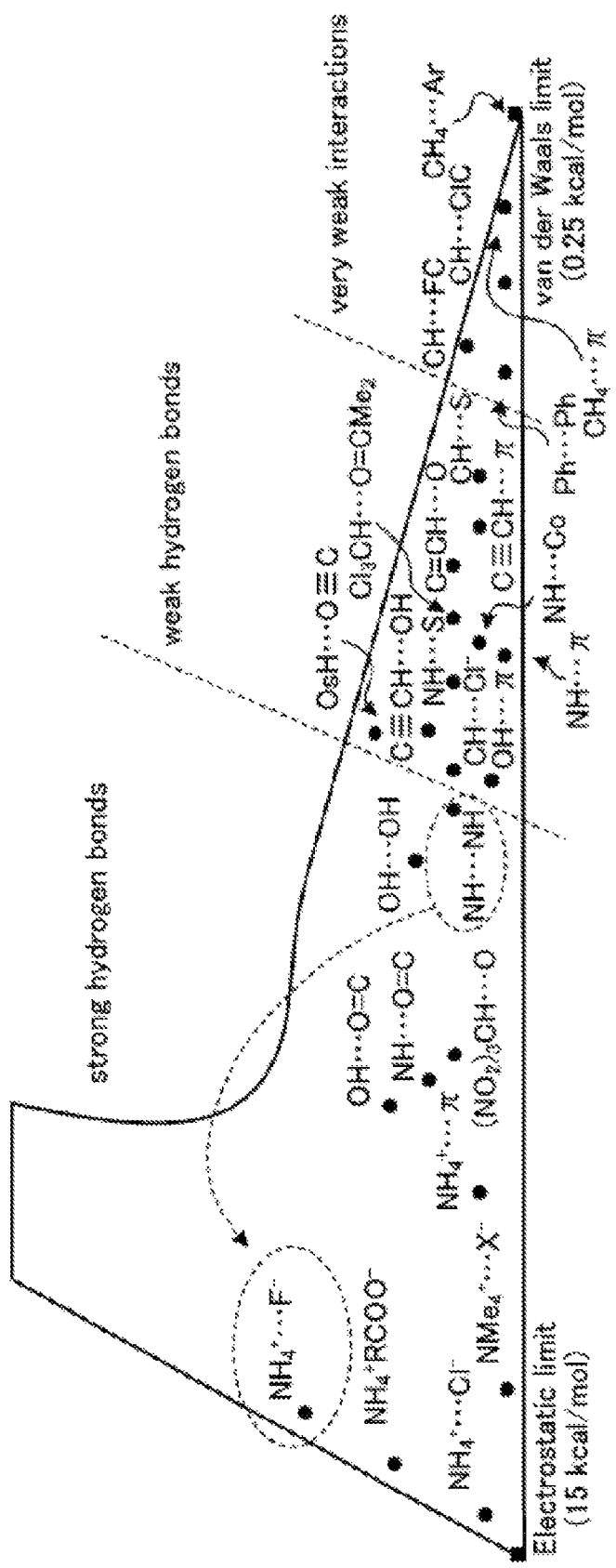
FIG. 6 is a view showing an example of a strong-weak relationship of a hydrogen bond.

FIG. 6 is a view showing an example of a strong-weak relationship of a hydrogen bond, which is disclosed the following document.

G. R. Desiraju, Acc. Chem. Res. 35, 565 (2002).

FIG. 6 is a view showing an arrangement of various types of hydrogen bonds according to strengths of bonds. In the left side of FIG. 6, a strong hydrogen bond is manifested. Further, a portion positioned to a more upper side in a horizontal axis of FIG. 6 manifests a stronger hydrogen bond. As shown in FIG. 6, a hydrogen bond between $NH_4^+$ . . . $F^-$ is stronger than a hydrogen bond between NH . . . NH (see an arrow indicated by a dotted line in FIG. 6). Thus, when the fluorine-containing $SiF_4$ gas is added to the SiN film, the hydrogen bond between $NH_4^+$ . . . $F^-$ is formed in the SiN film so that a hydrogen bond between the SiN particles is strengthened. Accordingly, a connection between the SiN particles in the SiN film is strengthened, thus further increasing a film density of the SiN film. This reduces a gap through which the water molecule passes. Accordingly, in the SiN film formed by adding the $SiF_4$ gas, the water molecule is further prevented from passing through the gap, thus enhancing a moisture-proof property of the sealing film.

In this case, if the concentration of fluorine in the sealing film 105 is too high, fluorine may react with moisture in the atmosphere, thus undergoing a color change. Because of this, in this embodiment, a ratio of a flow rate of the $SiF_4$ to the $SiH_4$ gas is controlled to be fallen within, e.g., a range from 0.1 to 0.4, such that the concentration of fluorine in the sealing film 105 is 10 atom % or less. In some embodiments, for example, when a chlorine-containing gas is used as the third gas, a ratio of a flow rate of the chlorine-containing gas to the $SiH_4$ gas may be controlled such that the concentration of chlorine in the sealing film 105 is 10 atom % or less.

So far, the first embodiment has been described. According to the film forming apparatus 10 of this embodiment, it is possible to provide the sealing film of a high moisture-proof property. Thus, it is possible to manufacture the light emitting module 100 having a thin thickness and the high moisture-proof property.

(Second Embodiment)

Hereinafter, a second embodiment will be described. A sealing film 105A of the second embodiment is different from the sealing film 105 of the first embodiment in that the sealing film 105A of the second embodiment has a multi-layered structure. Further, a configuration of a film forming apparatus used in the second embodiment is the same as that of the film forming apparatus 10 of the first embodiment described with reference to FIGS. 1 and 2, and thus, a detailed description thereof will be omitted. Also, an outline of a procedure of manufacturing a light emitting module 100A according to the second embodiment is also the same as that of the procedure of manufacturing the light emitting module 100 according to the first embodiment described with reference to FIG. 3, and thus, a detailed description thereof, except for the matters described hereinafter, will be omitted.

[Structure of Light Emitting Module 100A]

Figure 7:
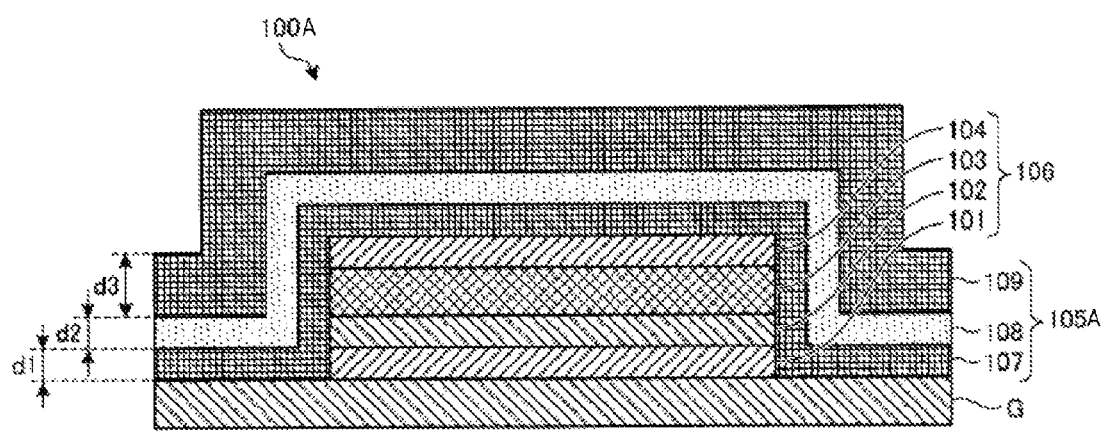
FIG. 7 is a cross-sectional view showing an example of a structure of a light emitting module according to a second embodiment.

FIG. 7 is a cross-sectional view showing an example of a structure of the light emitting module 100A according to the second embodiment. As shown in FIG. 7, for example, the light emitting module 100A includes an organic EL device 106 stacked on the glass substrate G, and a sealing film 105A stacked on the organic EL device 106 to cover the organic EL device 106. The sealing film 105A of this embodiment includes a first film 107, a second film 108, and a third film 109.

The first film 107 having a thickness d1 is stacked on the organic EL device 106 to cover the organic EL device 106. Subsequently, the second film 108 having a thickness d2 is stacked on the first film 107 to cover the first film 107. Thereafter, the third film 109 having a thickness d3 is stacked on the second film 108 to cover the second film 10. In this embodiment, the thickness d1 of the first film 107 is 0.5 to 1.5 times the thickness d2 of the second film 108. Further, in this embodiment, the thickness d3 of the third film 109 is two times or greater than (e.g., within a range from 2 to 4 times) the thickness d2 of the second film 108.

The second film 108 is an SiN film added with fluorine. In this embodiment, fluorine of a concentration ranging from 4 to 6 atom % (e.g., 5 atom %) is added to the second film 108. Further, an element added to the second film 108 may be a halogen element such as chlorine, in addition to fluorine. In some embodiments, a molecule having a functional group with an electronegative property stronger than that of nitrogen may be added to the second film 108. Further, the first film 107 and the third film 109 are SiN films in which a halogen element such as fluorine or a molecule having a functional group with an electronegative property stronger than that of nitrogen is not added.

Figure 8:
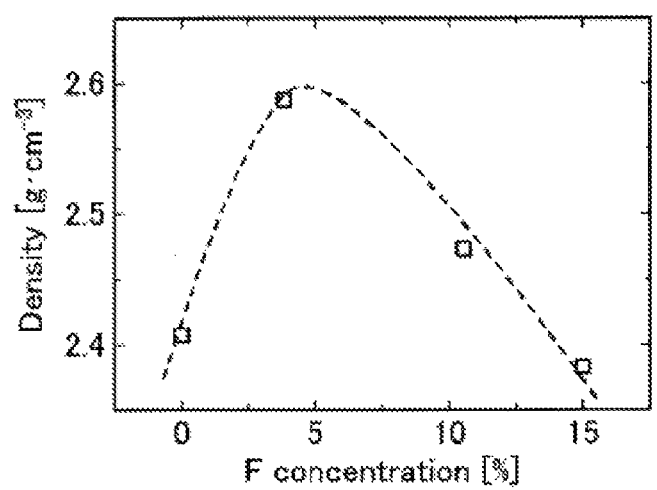
FIG. 8 is a view showing an example of a relationship between a concentration of fluorine and a film density.

FIG. 8 is a view showing an example of a relationship between a concentration of fluorine and a film density of the SiN film. The film density of the SiN film changes depending on the concentration of fluorine included in the SiN film. For example, as seen from the experimental result shown in FIG. 8, when the concentration of fluorine included in the SiN film ranges from 4 to 6 atom %, the film density of the SiN film has a maximum value. As the film density of the second film 108 as the SiN film increases, a gap through which water molecule passes is reduced. This enhances a moisture-proof property of the sealing film 105A that includes the second film 108.

Meanwhile, if the second film 108 containing fluorine is stacked on the organic EL device 106 without forming the first film 107 between the organic EL device 106 and the second film 108, the organic EL device 106 may be damaged by fluorine contained in the second film 108. For this reason, the organic EL device 106 is covered with the fluorine-free first film 107, and subsequently, the second film 108 containing fluorine is stacked on the first film 107. This prevents the organic EL device 106 from being damaged by fluorine contained in the second film 108.

Further, if the second film 108 is exposed to the atmosphere, fluorine contained in the second film 108 reacts with, e.g., oxygen of a high concentration, in the atmosphere, thus degrading the second film 108. This degrades a film density of the second film 108, which results in a reduced moisture-proof property. To address this, in this embodiment, the third film 109 is stacked on the second film 108. Thus, the second film 108 is protected by the third film 109 from the atmosphere. Therefore, the oxidation of the second film 108 can be restrained by the third film 109, thus suppressing the moisture-proof property of the second film 108 from being reduced.

[Details of Sealing Film Forming Step]

Figure 9:
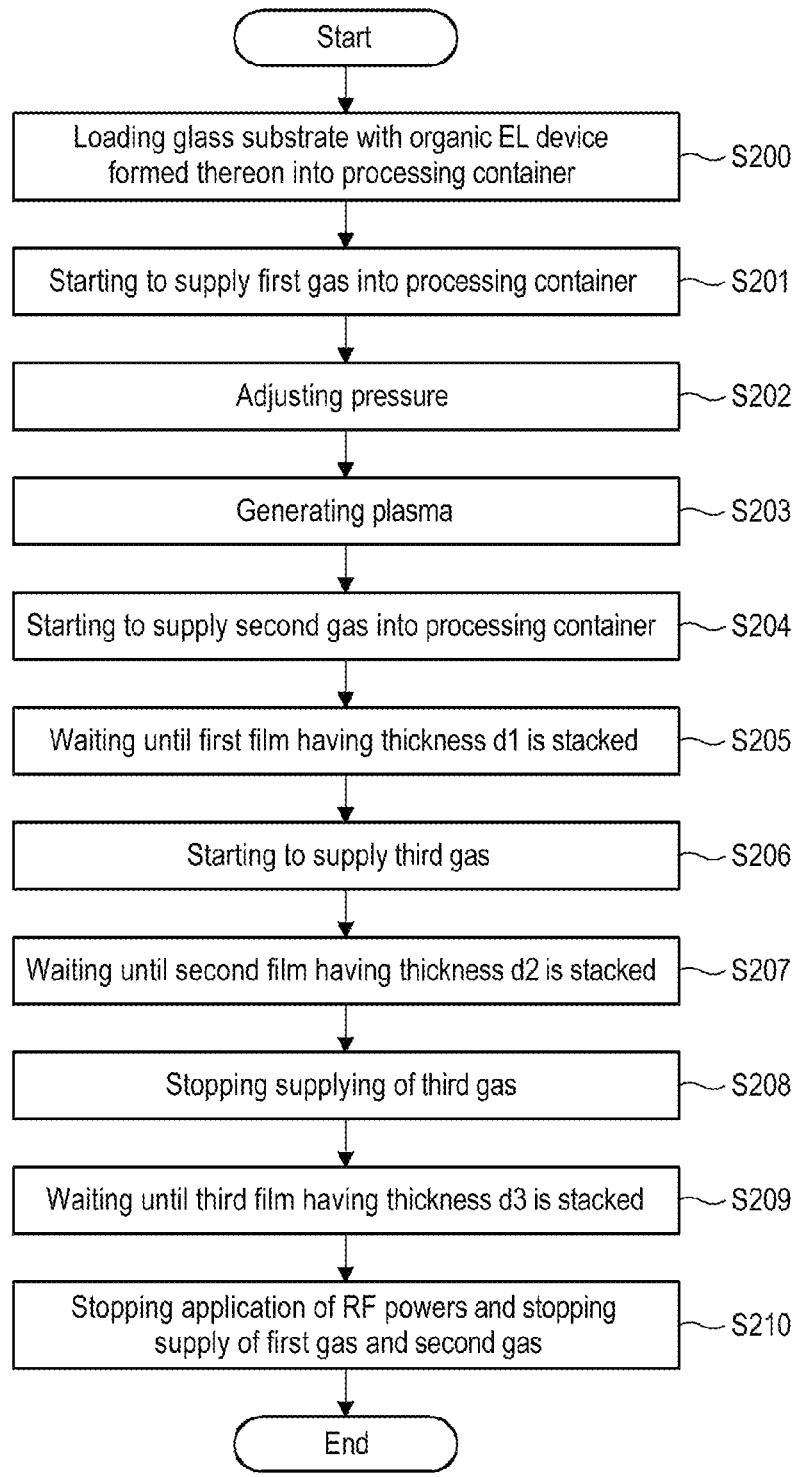
FIG. 9 is a flowchart showing an example of a sealing film forming step according to the second embodiment.
Figure 10:
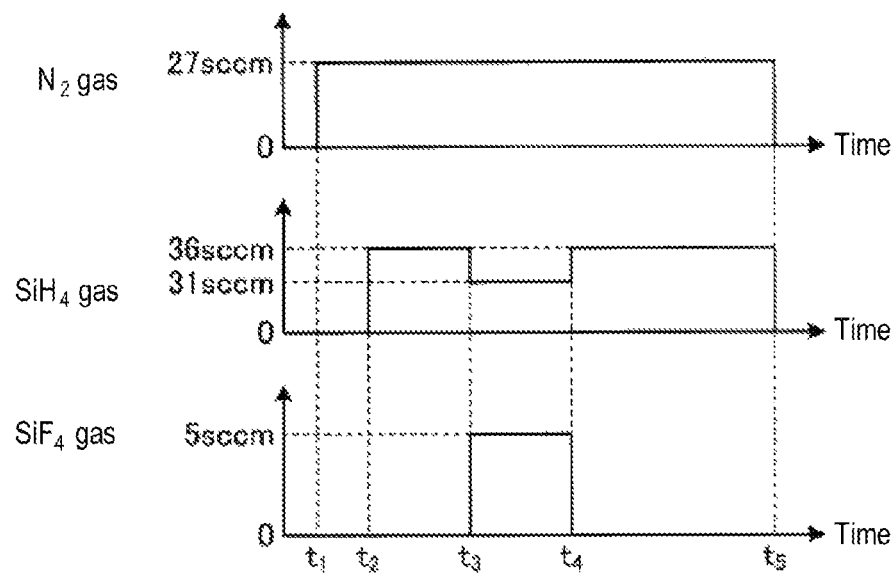
FIG. 10 is a view showing an example of a change in a flow rate of each process gas included in a mixture gas in the second embodiment.

FIG. 9 is a flowchart showing an example of a sealing film forming step according to a second embodiment. FIG. 10 is a view showing an example of a change in a flow rate of each process gas included in a mixture gas in the second embodiment. The sealing film forming step according to this embodiment is performed using, e.g., the film forming apparatus 10 shown in FIG. 1.

First, the gate valve 27 of the film forming apparatus 10 is opened, and the glass substrate G on which the organic EL device 106 is formed by other device is loaded into the processing chamber 4 through the opening 27a (in step S200). Thereafter, the controller 50 controls the electrostatic chuck to adsorb the glass substrate G through the susceptor 22.

Subsequently, for example, at a time $t_1$ shown in FIG. 10, the controller 50 controls the flow rate controller 201 and the valve 202 to discharge the first gas into the processing chamber 4 through the gas discharge holes 12a of the shower housing 11, thus starting to supply the first gas into the processing chamber 4 (in step S201). In this embodiment, the first gas is, e.g., an $N_2$ gas. The controller 50 controls the flow rate controller 201 to adjust a flow rate of the first gas to, e.g., 27 sccm.

Thereafter, the controller 50 controls the exhaust device 30 to exhaust the gas introduced into the processing chamber 4 through the exhaust pipe 31, thus adjusting the interior of the processing chamber 4 to a predetermined pressure atmosphere (in step S202). In some embodiments, the controller 50 controls the exhaust device 30 such that an internal pressure of the processing chamber 4 is, e.g., 0.5 Pa.

Subsequently, the controller 50 controls the RF power source 29 to apply an RF power of, e.g., 6 MHz, to the susceptor 22. Further, the controller 50 controls the RF power source 15 to apply an RF power of, e.g., 13.56 MHz, to the RF antenna 13. The application of the RF power to the RF antenna 13 forms an induced electric field within the processing chamber 4. The RF power applied to the RF antenna 13 is, e.g., 2000 W. The induced electric field formed within the processing chamber 4 generates plasma of a mixture gas containing the first gas within the processing chamber 4 (in step S203).

Thereafter, for example, at a time $t_2$ shown in FIG. 10, the controller 50 controls the flow rate controller 204 and the valve 205 to discharge the second gas into the processing chamber 4 through the gas discharge holes 12$a$ of the shower housing 11, thus starting to supply the second gas into the processing chamber 4 (in step S204). In this embodiment, the second gas is, e.g., an $SiH_4$ gas. The controller 50 controls each of flow rates of the first and second gases such that the sum of the flow rates of the first and second gases is substantially equal to the sum of the flow rates of the first to third gases in the first embodiment, for example. In this embodiment, since in step S201, the flow rate of the first gas has been adjusted to, e.g., 27 sccm, the controller 50 controls the flow rate controller 204 such that the flow rate of the second gas is, e.g., 36 sccm. Thus, the plasma generated within the processing chamber 4 leads to the disassociation of the first gas and the second gas, and film-forming species generated by the disassociation starts to be deposited on the organic EL device 106 formed on the glass substrate G to cover the organic EL device 106. The controller 50 waits for a first predetermined period of time until the first film 107 having a thickness d1 is stacked on the organic EL device 106 by the deposition of the film-forming species (in step S205).

Subsequently, after the lapse of the first predetermined period of time, i.e., at a time $t_3$ (see FIG. 10), the controller 50 controls the flow rate controller 207 and the valve 208 to discharge the third gas into the processing chamber 4 through the gas discharge holes 12$a$ of the shower housing 11, thus starting to supply the third gas into the processing chamber 4 (in step S206). In this embodiment, the third gas is, e.g., an $SiF_4$ gas. The controller 50 controls the flow rate controller 207 such that a flow rate of the third gas is, e.g., 5 sccm. Further, for example, the controller 50 reduces the flow rate of the second gas by the flow rate of the third gas such that the sum of the flow rates of the first to third gases is uniform. That is to say, the flow rate of the second gas is reduced from 36 sccm to 31 sccm, as shown in FIG. 10, for example.

Thus, the plasma generated within the processing chamber 4 leads to the disassociation of the first to third gases, and film-forming species generated by the disassociation start to be deposited on the first film 107 formed in step S205 to cover the first film 107. The controller 50 waits for a second predetermined period of time until the second film 108 having the thickness d2 is stacked on the first film 107 by the deposition of the film-forming species (in step S207).

Subsequently, after the lapse of the second predetermined period of time, i.e., at a time $t_4$ (see FIG. 10), the controller 50 controls the valve 208 to stop the supply of the third gas into the processing chamber 4 (in step S208). Along with the stop of the supply of the third gas, the controller 50 returns the flow rate of the second gas to the initial flow rate before the start of the supply of the third gas. That is to say, the flow rate of the second gas is increased from 31 sccm to 36 sccm, as shown in FIG. 10, for example.

Thereafter, the plasma generated within the processing chamber 4 leads to the disassociation of the first and second gases, and film-forming species generated by the disassociation start to be deposited on the second film 108. The controller 50 waits for a third predetermined period of time until the third film 109 having the thickness d3 is stacked on the second film 108 by the deposition of the film-forming species (in step S209).

Subsequently, after the lapse of the third predetermined period of time, i.e., at a time $t_5$ (see FIG. 10), the controller 50 controls the RF power source 15 and the RF power source 29 to stop the application of the RF powers, and controls the valve 202 and the valve 205 to stop the supply of the first and second gases (in step S210). Also, the controller 50 controls the exhaust device 30 to vacuum-exhaust the interior of the processing chamber 4 through the exhaust pipe 31. Thereafter, the gate valve 27 is opened, and the light emitting module 100A is unloaded from the processing chamber 4 through the opening 27$a$.

So far, the second embodiment has been described. According to the film forming apparatus 10 of this embodiment, in a case where the fluorine-containing SiN film is used as the sealing film 105A, the fluorine-free SiN film is interposed between the organic EL device 106 and the fluorine-containing SiN film. This configuration prevents the organic EL device 106 from being damaged by the fluorine. Further, according to the film forming apparatus 10 of this embodiment, the fluorine-containing SiN film is covered with the fluorine-free SiN film. This prevents the fluorine-containing SiN film from being oxidized by oxygen in the atmosphere, thus suppressing degradation in a moisture-proof property.

(Third Embodiment)

Hereinafter, a third embodiment will be described. A sealing film 105B of the third embodiment is different from the sealing film 105A of the second embodiment in that the sealing film 105B of the third embodiment includes a concentration gradient of fluorine applied in a thickness direction in the fluorine-free second film 108. Further, a film forming apparatus used in the third embodiment is similar in configuration with the film forming apparatus 10 of the first embodiment described with reference to FIGS. 1 and 2, and thus, a detailed description thereof will be omitted. Also, an outline of a procedure of manufacturing a light emitting module of the third embodiment is similar in a manufacturing procedure with the light emitting module 100 of the first embodiment described with reference to FIG. 3, and thus, a detailed description thereof, except for the matters described hereinafter, will be omitted.

[Structure of Light Emitting Module 100]

Figure 11:
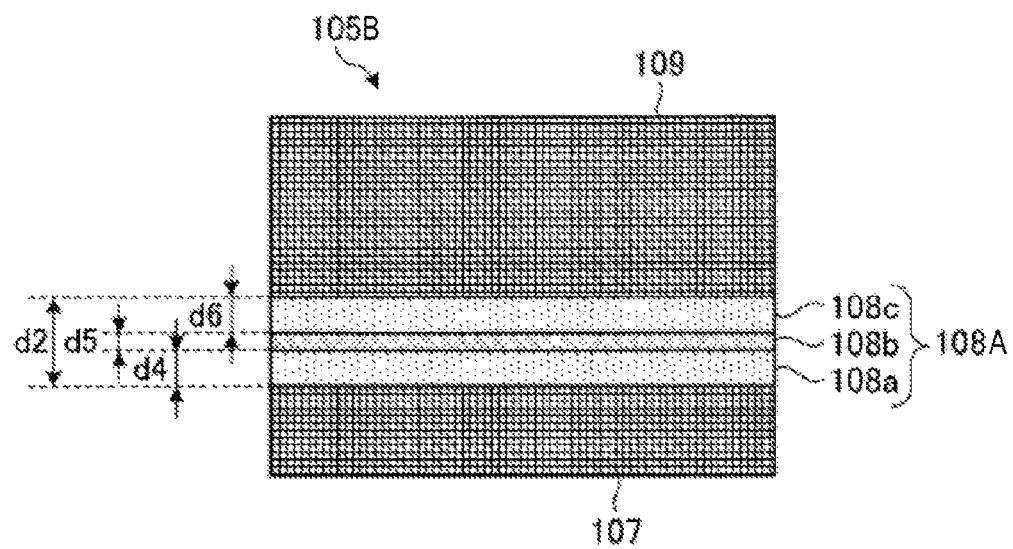
FIG. 11 is a cross-sectional view showing an example of a structure of a sealing film according to a third embodiment.

FIG. 11 is a cross-sectional view showing an example of a structure of the sealing film 105B according to the third embodiment. As shown in FIG. 11, for example, the sealing film 105B of this embodiment includes a first film 107, a second film 108A, and a third film 109. As shown in FIG. 11, for example, the second film 108A of this embodiment includes a first layer 108$a$, a second layer 108$b$, and a third layer 108$c$.

The first layer 108$a$ is formed to have a thickness d4. The first layer 108$a$ includes a concentration gradient in which a concentration of fluorine increases in a thickness direction from the first film 107 toward the third film 109. For example, the concentration of fluorine in the first layer 108$a$ monotonously increases from zero to a predetermined concentration. In this embodiment, the predetermined concentration represents that the concentration of fluorine ranges from 4 to 6 atom % (e.g., 5 atom %). The second layer 108$b$ is formed to have a thickness d5 and contains fluorine of a predetermined concentration. The third layer 108$c$ is formed to have a thickness d6 and has a concentration gradient in which a concentration of fluorine decreases in the thickness direction from the first film 107 toward the third film 109. For example, the concentration of fluorine in the third layer 108c monotonously decreases from a predetermined concentration to zero.

[Details of Step of Forming Second Film 108A]

Figure 12:
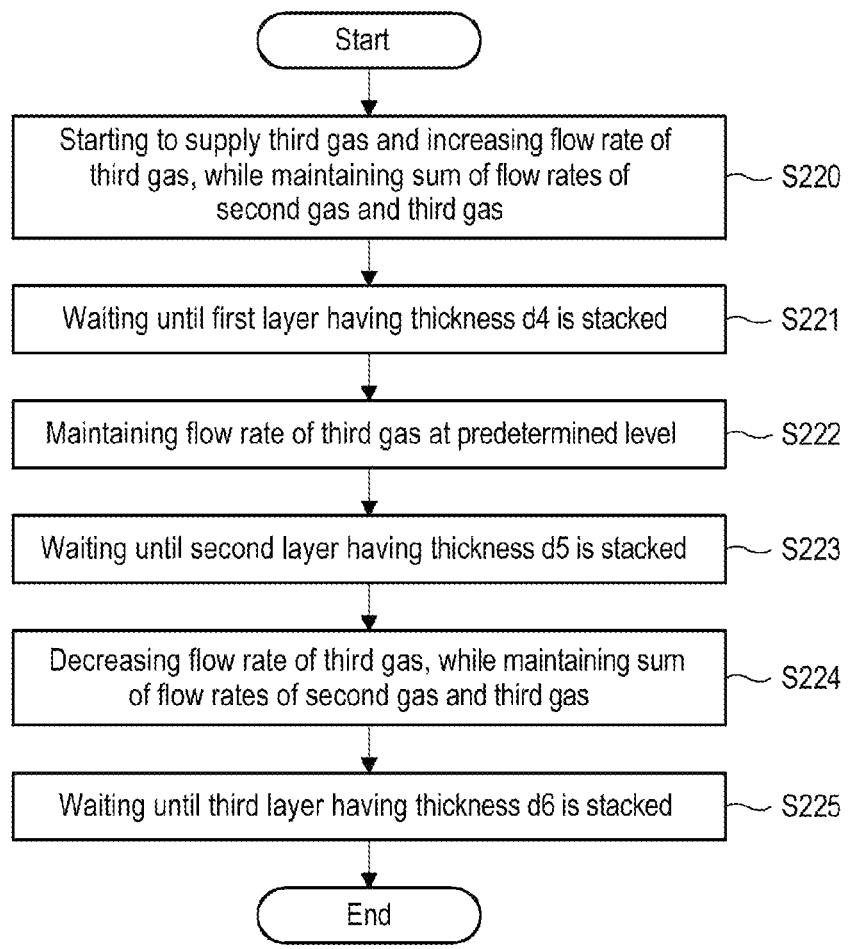
FIG. 12 is a flowchart showing an example of a second film forming step according to the third embodiment.
Figure 13:
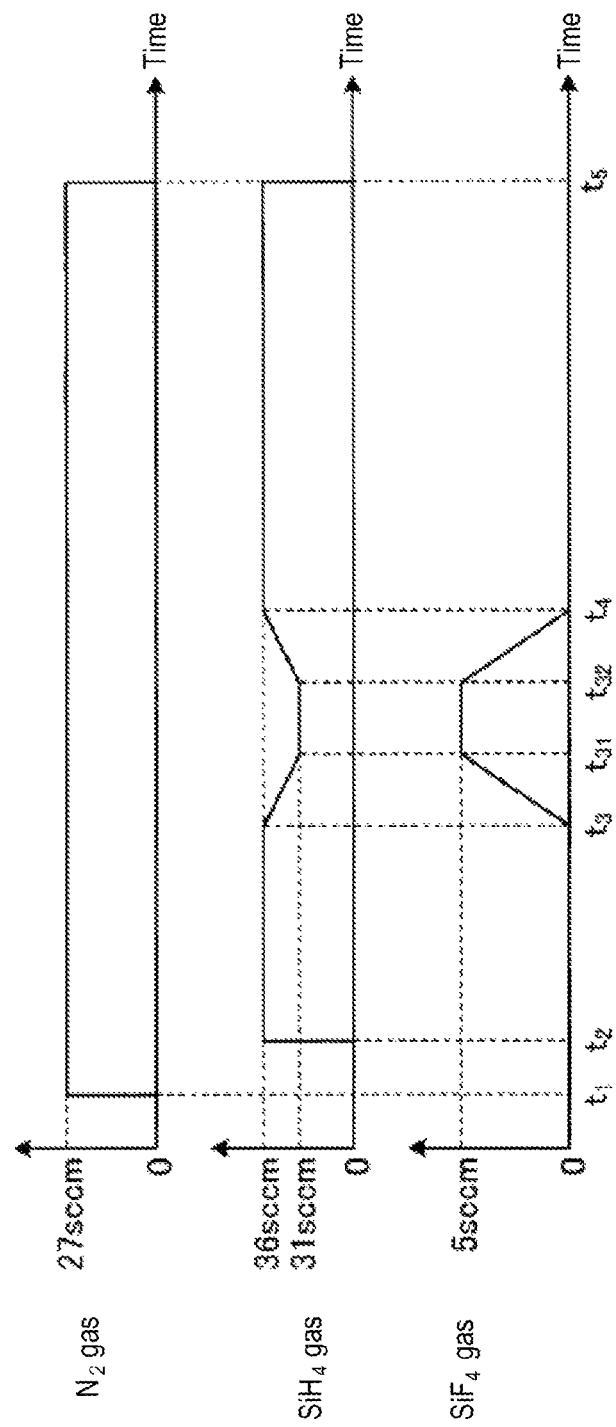
FIG. 13 is a view showing an example of a change in a flow rate of each process gas included in a mixture gas in the third embodiment.

FIG. 12 is a flowchart showing an example of a step of forming the second film 108A according to the third embodiment, which corresponds to a series of steps (i.e., S206 to S208) of forming the second film 105A in FIG. 9. FIG. 13 is a view showing an example of a change in flow rate of each process gas included in a mixture gas in the third embodiment.

For example, by the plasma of the first and second gases supplied into the processing chamber 4, the film-forming species of the first and second gases are deposited on the organic EL device 106, and the first film 107 having a predetermined thickness is stacked on the organic EL device 106 at a time $t_3$ (see FIG. 13). Further, for example, at the time $t_3$ shown in FIG. 13, along with the start of the supply of the third gas, the controller 50 controls the flow rate controller 204 and the flow rate controller 207 to increase a flow rate of the third gas from zero, while maintaining the sum of flow rates of the second and third gases (in step S220). As shown in FIG. 13, for example, the flow rate of the second gas decreases as the flow rate of the third gas increases. Thus, the first layer 108a in which the concentration of fluorine increases with an increase in thickness of the first layer 108a is stacked on the first film 107.

The controller 50 waits for a first predetermined period of time until the first layer 108a of the thickness d4 is stacked on the first film 107 (in step S221). After the lapse of the first predetermined period of time, the flow rate of the third gas is increased to a predetermined level. The predetermined level represents a flow rate at which the concentration of fluorine in the first layer 108a ranges from 4 to 6 atom % (e.g., 5 atom %). In FIG. 13, the flow rates of the second and third gases have been shown to be linearly changed, but may be changed in a curved shape or a stepped shape.

Subsequently, after the lapse of the first predetermined period of time, i.e., at a time $t_{31}$ (see FIG. 13), the controller 50 controls the flow rate controller 204 and the flow rate controller 207 to maintain the flow rate of the third gas at the predetermined level (in step S222). Thus, the second layer 108b in which the concentration of fluorine is maintained to a predetermined concentration in the thickness direction is stacked on the first layer 108a.

The controller 50 waits for a second predetermined period of time until the second layer 108b of the thickness d5 is stacked on the first layer 108a (in step S223). After the lapse of the second predetermined period of time, i.e., at a time $t_{32}$ (see FIG. 13), the controller 50 controls the flow rate controller 204 and the flow rate controller 207 to reduce the flow rate of the third gas from the predetermined level, while maintaining the sum of the flow rates of the second and third gases (in step S224). As shown in FIG. 13, for example, the flow rate of the second gas increases with the decrease in the flow rate of the third gas. Thus, the third layer 108c in which the concentration of fluorine decreases with an increase in thickness of the third layer 108c is stacked on the second layer 108b.

The controller 50 waits for a third predetermined period of time until the third layer 108c of the thickness d6 is stacked on the first layer 107 (in step S225). After the lapse of the third predetermined period of time (i.e., a time t4), the flow rate of the third gas becomes 0 sccm. Subsequently, the controller 50 controls the valve 208 to stop the supply of the third gas into the processing chamber 4, followed by executing step S209 and steps subsequent thereto, which are shown in FIG. 9. In this way, the second film 108A shown in FIG. 11 is formed.

So far, the third embodiment has been described. According to the film forming apparatus 10 of this embodiment, the second film 108A in which the concentration of fluorine increases toward the center of the second film 108A in the thickness direction is formed. Here, since both the first film 107 and the third film 109 that are in contact with the second film 108A do not contain fluorine, the first film 107 and the third film 109 have a film density lower than that of the second film 108A. If the second film 108A has the concentration gradient of fluorine as described above, stress may be applied to a boundary between the first film 107 and the second film 108A, which have different film densities, and a boundary between the second film 108A and the third film 109, which have different film densities.

In contrast, in the second film 108A of this embodiment, fluorine concentrations in both surfaces which face the first film 107 and the third film 109 are close to zero. This reduces the stress to be applied to the boundary between the first film 107 and the second film 108A, and the boundary between the second film 108A and the third film 109, thus increasing adhesion between the first film 107 and the second film 108A and adhesion between the second film 108A and the third film 109.

Further, in the second film 108A of this embodiment, the concentration of fluorine increases toward the center of the second film 108A in the thickness direction of the second film 108A. This forms a region having a high film density within the second film 108A, thus obtaining a high moisture-proof effect.

(Fourth Embodiment)

Hereinafter, a fourth embodiment will be described. A sealing film of the fourth embodiment is different from the sealing film 105A of the second embodiment, in that fluorine-containing second films and fluorine-free first films are alternately stacked. Further, a film forming apparatus used in the fourth embodiment is similar in configuration to the film forming apparatus 10 of the first embodiment described above with reference to FIGS. 1 and 2, and thus, a detailed description thereof will be omitted. Further, a light emitting module used in the fourth embodiment is similar in a manufacturing procedure to the light emitting module 100 of the first embodiment described with reference to FIG. 3. Thus, a description of the configuration of the film forming apparatus 10 and an outline of the manufacturing procedure of the light emitting module 100, except for the matters described hereinafter, will be omitted.

[Structure of Sealing Film 105C]

Figure 14:
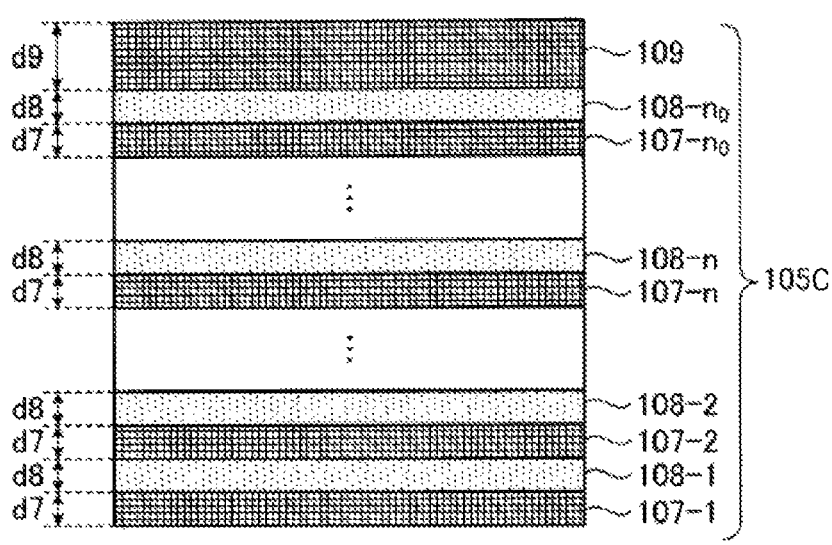
FIG. 14 is a cross-sectional view showing an example of a structure of a sealing film according to a fourth embodiment.

FIG. 14 is a cross-sectional view showing an example of a structure of the sealing film 105C according to the fourth embodiment. As shown in FIG. 14, for example, the sealing film 105C of this embodiment has a structure in which a plurality of first films 107-1 to 107-$n_0$ and a plurality of second films 108-1 to 108-$n_0$ are alternately stacked, and a third film 109 is stacked on the uppermost layer (i.e., the second film 108-$n_0$). In the sealing film 105C shown in FIG. 14, the first films 107-1 to 107-$n_0$ and the second films 108-1 to 108-$n_0$ are alternately stacked $n_0$ times.

The first films 107-1 to 107-$n_0$ are formed to have a substantially same thickness d7. The second films 108-1 to 108-$n_0$ are formed to have a substantially same thickness d8. Also, the thickness d7 of each of the first films 107-1 to 107-$n_0$ ranges from 0.5 to 1.5 times the thickness d8 of each of the second films 108-1 to 108-$n_0$. The third film 109 is formed to have a thickness d9 double or more (e.g., within a range from 2 to 4 times) as large as the thickness d8 of each of the second films 108-1 to 108-$n_0$.

In some embodiments, the thickness d7 of each of the first films 107-1 to 107-$n_0$ may be smaller than the thickness d1 of the first film 107 of the second embodiment. In some embodiments, the thickness d8 of each of the second films 108-1 to 108-$n_0$ may be smaller than the thickness d2 of the second film 108 of the second embodiment. In some embodiments, the thickness d9 of the third film 109 may be smaller than the thickness d3 of the third film 109 of the second embodiment.

[Details of Sealing Film Forming Process]

Figure 15:
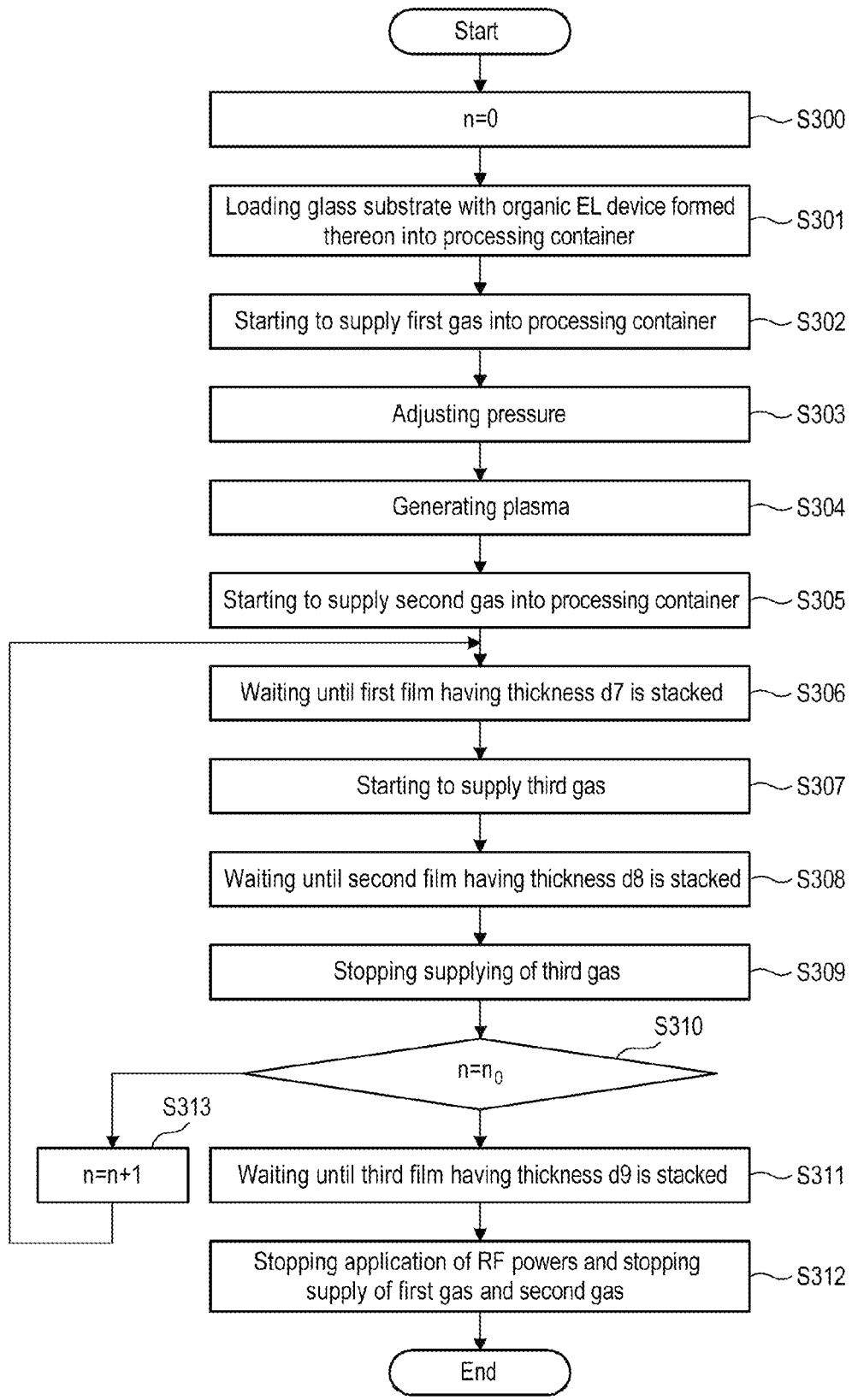
FIG. 15 is a flowchart showing an example of a sealing film forming step according to the fourth embodiment.

FIG. 15 is a flowchart showing an example of a process of forming the sealing film 105C according to the fourth embodiment. The sealing film forming process according to this embodiment is performed using, e.g., the film forming apparatus 10 shown in FIG. 1.

First, the controller 50 receives a constant $n_0$ indicating a stack number of alternately stacking the plurality of first films 107-1 to 107-$n_0$ and the plurality of second films 108-1 to 108-$n_0$. The controller 50 also initializes a variable n for counting the stack number to zero (in step S300). Thereafter, the controller 50 executes a sequence of subsequent steps S301 to S305. The sequence of steps S301 to S305 is similar to a sequence of steps S200 to S204 described with reference to FIG. 9, and thus, a description thereof will be omitted.

In step S305, plasma generated within the processing chamber 4 leads to the disassociation of the first and second gases, and film-forming species generated by the disassociation start to be deposited on the organic EL device 106 formed on the glass substrate G to cover the organic EL device 106. The controller 50 waits for a first predetermined period of time until the first film 107-1 of the thickness d7 is stacked by the deposition of the film-forming species (in step S306).

After the lapse of the first predetermined period of time, the controller 50 controls the flow rate controller 207 and the valve 208 to discharge the third gas into the processing chamber 4 through the gas discharge holes 12a of the shower housing 11, thus starting to supply the third gas into the processing chamber 4 (in step S307). In this embodiment, under the control of the controller 50, for example, the flow rate of the third gas (SiF$_4$ gas) is adjusted to 5 sccm, and the flow rate of the second gas (SiH$_4$ gas) is adjusted to 31 sccm.

Thus, the plasma generated within the processing chamber 4 leads to the disassociation of the first to third gases, and film-forming species generated by the disassociation start to be deposited on the first film 107-1 formed in step S305 to cover the first film 107-1. The controller 50 waits for a second predetermined period of time until the second film 108-1 of the thickness d8 is stacked on the first film 107-1 by the deposition of the film-forming species (in step S308).

Subsequently, after the lapse of the second predetermined period of time, the controller 50 controls the valve 208 to stop the supply of the third gas into the processing chamber 4 (in step S309). Along with the stop of the supply of the third gas, the controller 50 returns the flow rate of the second gas to a level, e.g., 36 sccm, before the start of the supply of the third gas.

Thereafter, the controller 50 determines whether the variable n has reached the constant $n_0$ received in step S300 (in step S310). When the variable n has not reached the constant $n_0$ ("NO" in S310), the controller 50 increments the variable n by one (in step S313) and again executes step S306.

Meanwhile, when the variable n has reached the constant $n_0$ ("YES" in S310), the controller 50 waits for a third predetermined period of time until the third film 109 of the thickness d9 is stacked on the uppermost second film 108-$n_0$ by the plasma of the first and second gases generated within the processing chamber 4 (in step S311).

Subsequently, after the lapse of the third predetermined period of time, the controller 50 controls the RF power source 15 and the RF power source 29 to stop the application of the RF powers, and controls the valve 202 and the valve 205 to stop the supply of the first gas and the second gas (in step S312). Thereafter, the controller 50 controls the exhaust device 30 to vacuum-exhaust the interior of the processing chamber 4 through the exhaust pipe 31. And then, the gate valve 27 is opened, and the light emitting module 100 is unloaded from the processing chamber 4 through the opening 27a.

So far, the fourth embodiment has been described. According to the film forming apparatus 10 of this embodiment, in a case where the fluorine-containing SiN film is used as the sealing film 105C, the fluorine-containing SiN films and the fluorine-free SiN films are alternately repeatedly stacked. This enhances a trap effect of water molecule, while constraining an additive amount of fluorine.

The present disclosure is not limited to the above embodiments and may be variously modified within the scope of the gist of the present disclosure.

While in the above embodiments, the first gas containing nitrogen or the like has been described to be, e.g., the N$_2$ gas, the present disclosure is not limited thereto. In some embodiments, an NH$_3$ gas may be used as the first gas.

Further, while in the above embodiments, the third gas containing fluorine or the like has been described to be, e.g., the SiF$_4$ gas, the present disclosure is not limited thereto. In some embodiments, an SiH$_x$F$_{4-x}$ (where x is an integer from 1 to 3) such as an SiH$_3$F gas or an SiH$_2$F$_2$ gas may be used as the third gas.

Further, while in the above embodiments, the third gas has been described to contain fluorine or the like, the present disclosure is not limited thereto. In some embodiments, the third gas may be a gas containing a halogen element other than fluorine, instead of fluorine, as long as the gas contains the halogen element. Examples of the third gas containing a halogen element may include an SiCl$_4$ gas, an SiH$_x$Cl$_{4-x}$ (where x is an integer from 1 to 3) gas, an SiH$_x$F$_y$Cl$_z$ (where x, y, and z are natural numbers that satisfy x+y+z=4) gas or the like. Further, by adding a chlorine-containing gas, it is possible to form a hydrogen bond of NH$_4^+$ . . . Cl$^-$ which has a bonding force stronger than that of a hydrogen bond between NH . . . NH.

Further, in the above embodiments, the SiF$_4$ gas has been described to be used as the third gas, but in some embodiments, a gas containing a functional group having an electronegative property stronger than that of nitrogen may be used as the third gas. Electrons are easy to adhere to the functional group having a strong electronegative property. Also, like F or Cl element having a strong electronegativity, the functional group having a strong electronegative property is maintained to be electrically negative even in the functional group is decomposed and separated from a gas in plasma within a film, thus easily forming a hydrogen bond. Examples of the functional group having an electronegative property stronger than that of nitrogen may include a carbonyl group, a carboxylate group or the like. When a gas having a function group such as carbonyl group: —C(=O)— or carboxylate group: (R)—COOH is added, the function group is mixed into the SiN film so that a hydrogen bond of NH . . . O=C or a hydrogen bond of $NH_4^+RCOO^-$ stronger than a hydrogen bond between NH . . . NH is formed. This strengthens the hydrogen bond between the SiN particles, which makes it possible to strengthen a connection between the SiN particles in the SiN film, thus further increasing a film density of the SiN film.

Further, while in the second to fourth embodiments, the fluorine-free first film 107 is installed between the fluorine-containing second film 108 and the organic EL device 106, the present disclosure is not limited thereto. In some embodiments, when a concentration of fluorine in the second film 108 is low, the first film 107 may not be formed between the second film 108 and the organic EL device 106. In particular, in a case where a concentration gradient of fluorine is applied such that the concentration of fluorine increases toward the center of the second film 108 in the thickness direction of the second film 108, a concentration of fluorine in each of upper and lower surfaces of the second film 108 is close to zero. Thus, if the second film 108 in which the concentration gradient of fluorine is applied is used, even though the second film 108 is stacked on the organic EL device 106, it is possible to lower damage of fluorine contained in the second film 108 to the organic EL device 106.

Further, while in the third embodiment, the second film 108A has been described to include the second layer 108b having a substantially uniform fluorine concentration, which is formed near the center of the second film 108 in the thickness direction, the present disclosure is not limited thereto. In some embodiments, the second layer 108b may not be formed in the second film 108A. In this case, the second film 108A includes the first layer 108a and the third layer 108c in which a concentration of fluorine increases toward the center of the second film 108A in the thickness direction. The concentration of fluorine in the first layer 108a is increased from zero to a predetermined level toward the center of the second film 108A in the thickness direction. Also, the concentration of fluorine in the first layer 108c is decreased from the predetermined level to zero as it is away from the center of the second film 108A in the thickness direction. Here, the predetermined level refers to a concentration of fluorine ranging from, e.g., 4 to 6 atom % (in some embodiments, 5 atom %).

Further, while in the fourth embodiment, the fluorine-containing second films 108-1 to 108-$n_0$ and the fluorine-free first films 107-1 to 107-$n_0$ has been described to be alternately stacked and a concentration gradient of fluorine has been described to be not applied in the fluorine-containing second films 108-1 to 108-$n_0$, the present disclosure is not limited thereto. In some embodiments, each of the fluorine-containing second films 108-1 to 108-$n_0$ may have a concentration gradient of fluorine such that the concentration of fluorine is increased toward the center of the sealing film 105C in the thickness direction. Accordingly, according to the fourth embodiment, it is possible to reduce stress to be applied to respective boundaries between the first films 107-1 to 107-$n_0$ and the second films 108-1 to 108-$n_0$, and a boundary between the uppermost second film 108-$n_0$ and the third film 109 may be reduced.

Figure 16:
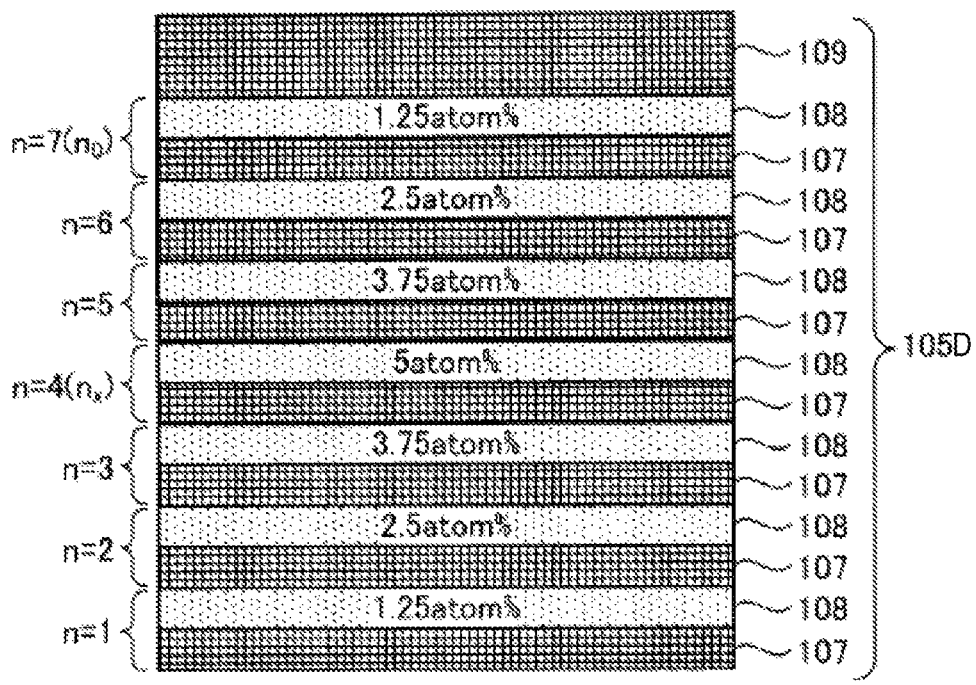
FIG. 16 is an explanatory view showing another example of a structure of a sealing film.

In some embodiments, as shown in FIG. 16, a sealing film 105D in which fluorine-containing second films 108 and fluorine-free first films 107 are alternately stacked $n_0$ times may be provided. In the sealing film 105D, a concentration of fluorine in each of the second films 108 may be increased or decreased in a stepwise manner such that the concentration of fluorine in the substantially middle second film 108 which is stacked at about half of the $n_0$ times is maximized.

Specifically, when the constant $n_0$ indicating the stack number of the first films 107 and the second films 108 is an even number, a concentration of fluorine in, e.g., the $(n_0/2+1)$th second film 108 may be maximized. Also, when the constant $n_0$ is an odd number, a concentration of fluorine in, e.g., the $((n_0+1)/2)$th second film 108 may be maximized.

Assuming that a second film having the maximum fluorine concentration is the $(n_x)$th second film 108, the 1st second film 108 to the $(n_x-1)$th second film 108 are sequentially stacked from below. Assuming that the maximum fluorine concentration is X, fluorine concentrations of the 1st to $(n_x-1)$th second films 108 are calculated by sequentially incrementing a value obtained by dividing the concentration X by $(n_x-1)+1$, i.e., by dividing the concentration X into equal parts. And, the 1st to $(n_x-1)$th second films 108 having the sequentially-incremented fluorine concentrations are stacked in the stepwise manner, respectively.

Meanwhile, the $(n_x+1)$th to $(n_0)$th second films 108 are sequentially stacked on the $(n_x)$th second film 108. As described above, assuming that the maximum fluorine concentration of second film 108 is X, fluorine concentrations of the $(n_x+1)$th to $(n_0)$th second films 108 are calculated by sequentially decrementing a value obtained by dividing the concentration X by $(n_0-n_x)+1$, i.e., by dividing the concentration X into equal parts. And, the $(n_x+1)$th to $(n_0)$th second film 108 having the sequentially-decremented fluorine concentrations are stacked in the stepwise manner, respectively.

In the sealing film 105D shown in FIG. 16, $n_0$ is 7, $n_x$ is 4, and X is 5 atom %. In the sealing film 105D shown in FIG. 16, the fluorine concentration is set to be incremented by $5/((4-1)+1)=1.25$ atom % for n=1 to $n_x$. Further, in the sealing film 105D shown in FIG. 16, the fluorine concentration is decremented by $5/((7-4)+1)=1.25$ atom % for n=$n_x$ to $n_0$.

As described above, in the sealing film 105D in which the fluorine-containing second films 108 and the fluorine-free first films 107 are alternately stacked, the second films 108 are formed to have a higher fluorine concentration in a stepwise manner as the second films 108 are positioned closer to the center of the sealing film 105D in the thickness direction of the sealing film 105D. This reduces the overall stress of the sealing film 105D.

In some embodiments, the sealing film 105D shown in FIG. 16 may include the second films 108 having the same thickness or different thicknesses depending on values of fluorine concentrations. Similarly, the first films 107 may have the same thickness or different thicknesses depending on a value of a fluorine concentration of the respective second film 108 adjacent thereto.

Figure 17:
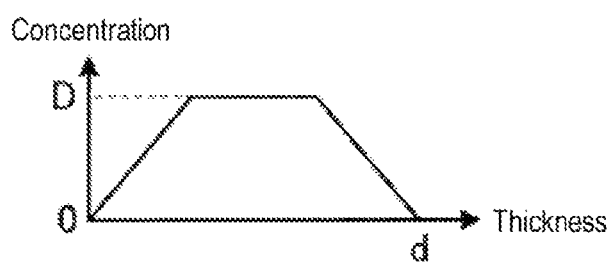
FIG. 17 is an explanatory view showing an example of a fluorine concentration gradient.

Further, in some embodiments, each of the second films 108 included in the sealing film 105D shown in FIG. 16 may have a fluorine concentration gradient in the thickness direction of the second film 108. In this case, for example, as shown in FIG. 17, the fluorine concentration gradient applied to each of the second films 108 may be set such that a concentration of fluorine is increased toward the center of the second film 108 in the thickness direction of the second film 108. In the example shown in FIG. 17, the fluorine concentrations of the second films 108 are increased from zero to a predetermined level D from a boundary between the first film 107 and the second film 108 toward the vicinity of the center of the second film 108 in the thickness direction of the second film 108. The concentration of fluorine in the vicinity of the center of the second film 108 is maintained at the predetermined level D. Here, the predetermined level D represents a concentration determined depending on values of $n_0$, $n_x$, and X with respect to the second film 108 as a target.

Figure 18:
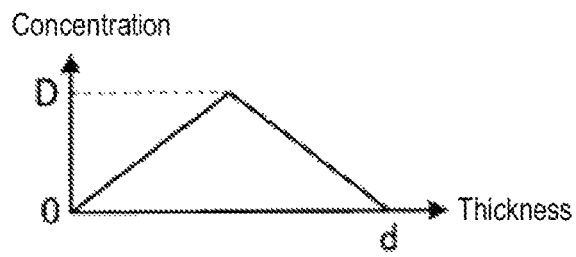
FIG. 18 is an explanatory view showing another example of a fluorine concentration gradient.

In some embodiments, for example, as shown in FIG. 18, the concentration of fluorine in the second film 108 may be increased from zero to a predetermined level D from a boundary between the first film 107 and the second film 108 toward the vicinity of the center of the second film 108 in the thickness direction of the second film 108. Subsequently, he concentration of fluorine may be decreased from the predetermined level D to zero, without maintaining the predetermined level D.

As described above, in the sealing film 105D in which the fluorine-containing second films 108 and the fluorine-free first films 107 are alternately stacked, the fluorine concentration gradients are applied to each of the second films 108 such that the concentration of fluorine is increased toward the center of the second film 108 in the thickness direction of the second film 108 and such that the concentration of fluorine in each of the second films 108 positioned in the vicinity of boundaries between the respective first films 107 and the respective second films 108 is zero. With this configuration, it is possible to form a layer having a predetermined concentration of fluorine in each of the second films 108 and reduce stresses between the respective first films 107 and the respective second films 108.

Further, while in the above embodiments, the film forming apparatus 10 configured to form a film by a CVD method using the inductively-coupled plasma as a plasma source, has been described as an example, the present disclosure is not limited thereto. As an example, as long as the film forming apparatus 10 forms a film by the CVD method using plasma, a certain plasma source such as a capacitively-coupled plasma, a microwave plasma, or a magnetron plasma may be used.

Further, in the above embodiments, the film forming method which forms the sealing film 105 (105A, 105B, 105C or 105D) to seal the organic EL device 106 has been described, but a device sealed by the sealing film 105 (105A, 105B, 105C or 105D) is not limited to the organic EL device 106. The present disclosure may also be applied to a film forming method which forms a film to seal a device such as a semiconductor device, a solar cell device or the like, in addition to the organic EL device 106.

According to the present disclosure in some embodiments, it is possible to provide a film forming method and a film forming apparatus, which are capable of forming a sealing film to seal a device such as an organic EL device, the sealing film having a high moisture-proof property and a thin thickness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a sealing film to seal a device formed on a substrate, comprising:

supplying a first gas containing nitrogen into a processing container;
generating plasma of the first gas within the processing container;
supplying a silicon-containing gas into the processing container as a second gas to form a first sealing film to cover the device using the gas activated by the plasma;
supplying a $SiH_xF_yCl_z$ (where x, y, and z are natural numbers satisfying x+y+z =4) gas as a third gas to form a second sealing film on the first sealing film; and
stopping the supply of the third gas to form a third sealing film on the second sealing film, wherein a flow rate of the third gas is increased from zero from a start of the supply of the third gas while maintaining a sum of flow rates of the second gas and the third gas, is maintained at predetermined level, and is reduced to zero while maintaining the sum of the flow rates of the second and third gases.

2. The method of claim 1, wherein the first gas is an $N_2$ gas or an $NH_3$ gas,
the second gas is an $SiH_4$ gas.

3. The method of claim 1, wherein a thickness of the third sealing film is 2 to 4 times as large as the second sealing film.

4. The method of claim 1, wherein a thickness of the first sealing film falls within a range from 0.5 to 1.5 times that of the second sealing film.

5. The method of claim 1, wherein the predetermined level falls within a range from 4 to 6 atom %.

6. The method of claim 1, wherein a temperature of the substrate in forming the second sealing film ranges from 10 to 70 degrees C.

7. A film forming apparatus, comprising:
a processing container;
a gas supply unit configured to supply a first mixture gas into the processing container;
a plasma generating unit configured to generate plasma of the first mixture gas within the processing container; and
a controller configured to execute the film by a method comprising:
supplying a first gas containing nitrogen into a processing container:
generating plasma of the first gas within the processing container;
supplying a silicon-containing gas into the processing container as a second gas to form a first sealing film to cover the device using the gas activated by the plasma;
supplying a halogen element containing gas or a gas containing a functional group having an electronegative property stronger than that of nitrogen into the processing container as a third gas to form a second sealing film on the first sealing film; and
stopping the supply of the third gas to form a third sealing film on the second sealing film,
wherein a flow rate of the third gas is increased from zero from a start of the supply of the third gas while maintaining a sum of flow rates of the second gas and the third gas, is maintained at predetermined level, and is reduced to zero while maintaining the sum of the flow rates of the second and third gases,
and wherein the third gas is any one of an $SiH_xF_yCl_z$, (where x, y, and z are natural numbers satisfying x+y+z=4) gas.

* * * * *